(12) United States Patent
Yoneda et al.

(10) Patent No.: US 10,514,516 B2
(45) Date of Patent: Dec. 24, 2019

(54) SEMICONDUCTOR OPTICAL DEVICE MONOLITHICALLY INTEGRATING OPTICAL WAVEGUIDES WITH PHOTODIODES HAVING A SHARED BIAS PAD AND APPARATUS IMPLEMENTING THE SAME

(71) Applicant: SUMITOMO ELECTRIC DEVICE INNOVATIONS, INC., Yokohama-shi (JP)

(72) Inventors: Yoshihiro Yoneda, Yokohama (JP); Ryuji Masuyama, Yokohama (JP); Takuya Okimoto, Yokohama (JP)

(73) Assignee: SUMITOMO ELECTRIC DEVICE INNOVATIONS, INC., Yokohama-shi (JP)

( * ) Notice: Subject to any disclaimer, the term of this patent is extended or adjusted under 35 U.S.C. 154(b) by 0 days.

(21) Appl. No.: 15/909,235

(22) Filed: Mar. 1, 2018

(65) Prior Publication Data
US 2018/0252881 A1    Sep. 6, 2018

(30) Foreign Application Priority Data
Mar. 3, 2017   (JP) ................ 2017-040631

(51) Int. Cl.
*G02B 6/42* (2006.01)
*G02B 6/26* (2006.01)
*H01L 31/0232* (2014.01)
*H01L 31/101* (2006.01)
(Continued)

(52) U.S. Cl.
CPC ............. *G02B 6/4295* (2013.01); *G02B 6/26* (2013.01); *H01L 31/02327* (2013.01);
(Continued)

(58) Field of Classification Search
CPC .............. G02B 6/4295; G02B 6/43; G02B 6/4202–4203; G02B 6/12004;
(Continued)

(56) References Cited

U.S. PATENT DOCUMENTS

| 2012/0106984 A1* | 5/2012 | Jones | ..................... H04B 10/60 398/214 |
| 2013/0071129 A1* | 3/2013 | Yoneda | .............. G02B 6/12004 398/214 |

(Continued)

FOREIGN PATENT DOCUMENTS

JP     2013-110207 A     6/2013

*Primary Examiner* — Younes Boulghassoul
(74) *Attorney, Agent, or Firm* — Baker Botts L.L.P; Michael A. Sartori

(57) ABSTRACT

A functional optical device applicable to a coherent optical communication system as a front end device is disclosed. The functional optical device includes a pair of light-receiving elements of a type of waveguide photodiode (PD), a pair of signal pads, a pair of ground pads, a bias pad, and a substrate that monolithically integrates those elements thereon. The light-receiving elements generate a photocurrent complementary to each other in respective anodes thereof; while, receive biases through the bias pad common to the light-receiving elements. Those pads are disposed along an edge of the substrate such that the signal pads put the bias pads therebetween, and the ground pads put the signal pads and the bias pad therebetween.

12 Claims, 10 Drawing Sheets

(51) Int. Cl.
*H01L 31/0224* (2006.01)
*H04B 10/69* (2013.01)
*H01L 31/0304* (2006.01)
*H01L 31/105* (2006.01)
*G02B 6/12* (2006.01)

(52) U.S. Cl.
CPC ............... *H01L 31/022408* (2013.01); *H01L 31/03046* (2013.01); *H01L 31/101* (2013.01); *H01L 31/105* (2013.01); *H04B 10/691* (2013.01); *G02B 6/12004* (2013.01)

(58) Field of Classification Search
CPC .. G02B 6/12007–12019; G02B 6/2813; G02B 2006/1215; G02B 2006/12152; G02B 2006/12078; H01L 31/165; H01L 31/02327; H01L 31/1844; H01L 31/03046; H01L 31/105; H01L 31/109; G02F 1/2257; G02F 1/21
See application file for complete search history.

(56) References Cited

U.S. PATENT DOCUMENTS

| | | | |
|---|---|---|---|
| 2013/0330038 A1* | 12/2013 | Onishi | G02B 6/262 385/31 |
| 2014/0070351 A1* | 3/2014 | Masuyama | H01L 31/02325 257/432 |
| 2014/0246746 A1* | 9/2014 | Yoneda | H01L 31/105 257/432 |
| 2015/0260933 A1* | 9/2015 | Masuyama | G02B 6/4274 385/14 |
| 2016/0011439 A1* | 1/2016 | Kitamura | G02F 1/218 385/2 |
| 2016/0026064 A1* | 1/2016 | Masuyama | G02F 1/025 385/2 |
| 2016/0380023 A1* | 12/2016 | Yoneda | H01L 27/1446 257/432 |
| 2018/0252865 A1* | 9/2018 | Yoneda | G02F 1/21 |

* cited by examiner

SEMICONDUCTOR OPTICAL DEVICE MONOLITHICALLY INTEGRATING OPTICAL WAVEGUIDES WITH PHOTODIODES HAVING A SHARED BIAS PAD AND APPARATUS IMPLEMENTING THE SAME

CROSS REFERENCE TO RELATED APPLICATIONS

The present application is based on and claims the benefit of priority of Japanese Patent Application No. 2017-040631, filed on Mar. 3, 2017, the entire content of which is incorporated herein by reference.

BACKGROUND

1. Field of Invention

The present invention relates to a functional optical device that monolithically integrates an optical waveguide with a light-receiving element on a semiconductor substrate.

2. Background Art

A Japanese Patent laid open No. JP-2013-110207A has disclosed a functional optical device that monolithically integrates an optical waveguide with a light-receiving element on a semiconductor substrate common to the optical waveguide and the light-receiving element. Such a functional optical device is applicable to a coherent optical communication system. Recent optical communication system, reflecting a continuous request to increase volume to be transmitted, has enhanced the speed thereof, for instance, exceeding 40 Gbps and sometimes reaching 400 Gbps, and adopted complicated algorithm to multiplex signals. An optical receiver, accordingly, is inevitable to give solutions for such request.

One type of optical receiver called as a waveguide photodiode (PD) is adequate the functional optical device that monolithically integrates the light-receiving element with the optical waveguide, where the waveguide PD receives photons from the optical waveguide along an absorption layer. In order to enhance response, in particular, high frequency response of the waveguide PD, the absorption layer is necessary to be thinned to shorten a transit time of minority carriers. However, a thinned absorption layer also increases parasitic capacitance between electrodes sandwiching the absorption layer, which brings disadvantages in the high frequency response.

SUMMARY

Aspects of the present invention relates to a functional optical device and an optical apparatus implementing the functional optical device. The functional optical device includes a coupling unit, a pair of optical waveguides, a pair of light-receiving elements, a pair of signal pads, a pair of ground pads, and a bias pad, and a substrate. The coupling unit generates a pair of optical signals complementary to each other by preforming interference between signal light and local light. The optical waveguides carry the optical signals from the coupling unit to the light-receiving elements. The light-receiving elements, which have a type of waveguide photodiode (PD) having an anode and a cathode. The light-receiving elements generate a pair of photocurrents complementary to each other based on the optical signals carried on the optical waveguides. The signal pads are connected with the anodes of the light-receiving elements. The bias pad is connected with the respective cathodes of the light-receiving elements. A feature of the functional optical device of the present invention is that the substrate monolithically integrates the coupling unit, the optical waveguides, the light-receiving elements, and those pads thereon; and the signal pads put the bias pad therebetween, and the ground pads put the signal pads and the bias pad therebetween.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments according to the present invention will be described as referring to accompanying drawings. The present invention, however, is not restricted to those embodiments, and has a scope defined in claims and equivalents thereof. Also, in the description of the drawings, numerals or symbols same with or similar to each other will refer to elements same with or similar to each other without duplicating explanations. A technical term of "un-dope" means that a subject material is not intentionally doped and has impurity density less than, for instance, $1 \times 10^{15}$ cm$^{-3}$.

An embodiment of the present invention relates to a light-receiving apparatus applicable to a coherent optical system, where the light-receiving apparatus includes a functional optical device monolithically integrating multi-mode interference (MMI) couplers operable as an optical 90° hybrid. In particular, the invention relates to techniques to widen a frequency bandwidth and to make response faster between the functional optical device and an amplifying device put downstream of the functional optical device.

Figure 1:
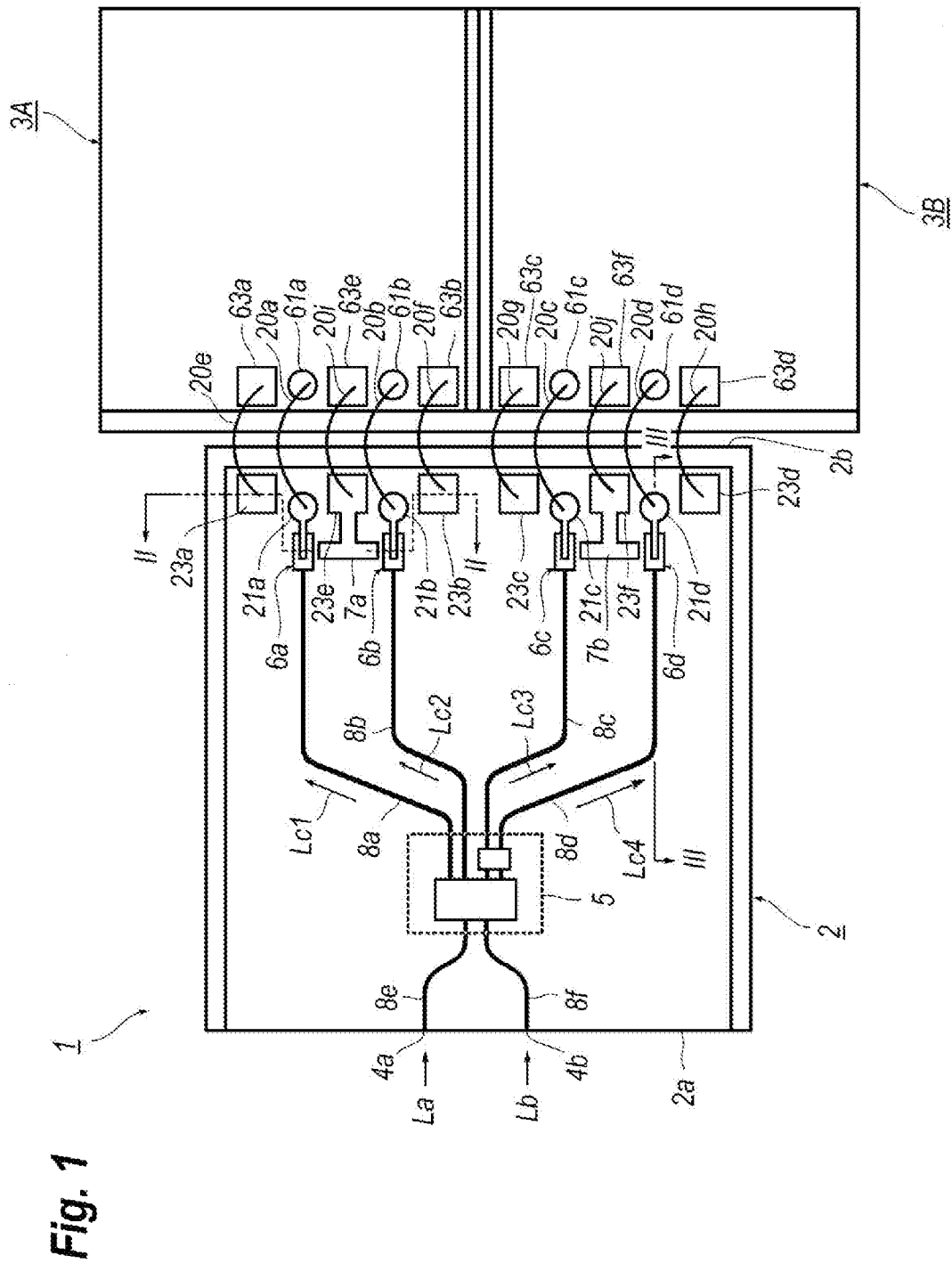
FIG. 1 is a plan view showing an optical apparatus according to an embodiment of the present invention.
Figure 2:
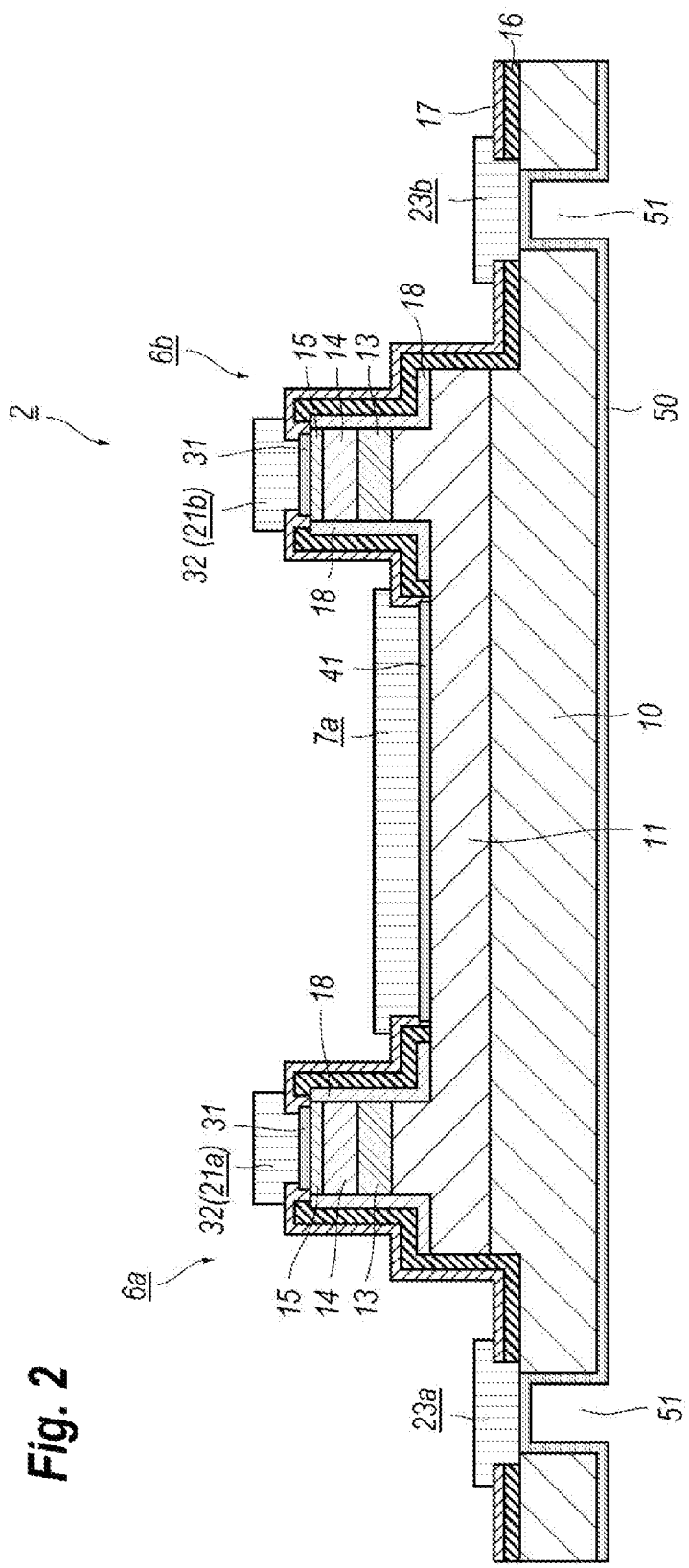
FIG. 2 is shows a cross section of the functional optical device shown in FIG. 1, which is taken along the line II-II indicated in FIG. 1.

FIG. 1 is a plan view of an optical apparatus 1 that is applicable to a front-end receiver of the coherent communication system; FIG. 2 shows a cross section of the optical apparatus 1 taken along the line II-II indicated in FIG. 1 and FIG. 3 also shows a cross section thereof taken along the line III-III shown in FIG. 1.

The optical apparatus 1 of the present embodiment provides the functional optical device 2, and two amplifier units, 3A and 3B. The functional optical device 2, which has a rectangular plane shape, monolithically integrates two input ports, 4a and 4b, a coupling unit 5, a plurality of optical waveguides, 8a to 8f, and light-receiving elements, 6a to 6d, on a substrate 10 that is made of compound semiconductor materials, typically, indium phosphide (InP).

The functional optical device 2 provides two edges, 2a and 2b, in respective ends thereof opposite to each other, one of which will be called as a front edge 2a, while, the other will be called as a rear edge 2b. However, references of "front" and "rear" are merely for sakes of explanation, and do not restrict scope of the invention. The two ports, 4a and 4b, are provided in the front edge 2a, where the former port 4a receives signal light La that multiplexes two signals each modulated by an algorithm of the quadrature phase shift keying (QPSK), while, the latter port 4b receives local light Lb. Accordingly, the two ports, 4a and 4b, are sometimes called as the signal port and the local port, respectively. Two ports, 4a and 4b, couple with the coupling unit 5 via optical waveguides, 8e and 8f. The optical waveguides, 8a to 8f, in the functional optical device 2 may have an optical confinement structure including a core layer and cladding layers sandwiching the core layer, where the core layer may be made of material, typically, InGaAsP, having refractive index relatively higher than those of materials constituting the cladding layers, which is typically made of InP.

The coupling unit 5 is a type of 90° optical hybrid. That is, the coupling unit 5 includes multi-mode interference (MMI) couplers where the signal light La interferes with the local light Lb, thus the coupling unit 5 may extract four signals, Lc1 to Lc4, two of which, Lc1 and Lc2, have phase components of, what is called as the in-phase components that are complementary to each other, while, the rest of two signals, Lc3 and Lc4, have other phase components of, what is called as the quadrature-phase also complementary to each other but different from the former two components, Lc1 and Lc2 by 90°. Specifically, the signals, Lc1 to Lc4, have relations in the phases of 0, π, π/2, and 3π/2 against the phase of the local light Lb, and amplitudes of two-levels.

The light-receiving elements, 6a and 6d, may have an arrangement of, what is called as a waveguide PIN photodiode (PD), and may be disposed along the rear edge 2b facing the amplifier units, 3A and 3B. The waveguide PIN-PD means that a light-sensitive layer generates photocurrents by absorbing photons entering along the layer. The functional optical device 2 may further provide signal pads, 21a to 21d, arranged also along the rear edge 2b of the functional optical device 2. The signal pads, 21a to 21d, are connected with respective anodes of the light-receiving elements, 6a to 6d. Bonding wires, 20a to 20d, connect the signal pads, 21a to 21d, with signal pads, 61a to 61d, provided on the amplifier units, 3A and 3B. Thus, the anodes of the light-receiving elements, 6a to 6d, are connected with the amplifier units, 3A and 3B, through the signal pads, 21a to 21d, and the bonding wires, 20a to 20d.

The light-receiving elements, 6a to 6d, may be optically coupled with the coupling unit 5 through the optical waveguides, 8a and 8d. That is, the light-receiving elements, 6a to 6d, may receive the optical signals, Lc1 to Lc4, output from the coupling unit 5 through respective optical waveguides, 8a to 8d, and convert thus received optical signals, Lc1 to Lc4, into photocurrents, and provide thus converted photocurrents to the amplifier units, 3A and 3B.

Two of light-receiving elements, 6a and 6b, are connected with each other through a bias line 7a that provides a bias pad 23e between the light-receiving elements, 6a and 6b, where the bias pad 23e is connected with a bias pad 63e provided on the amplifier unit 3A through a bonding wire 20i. That is, the light-receiving elements, 6a and 6b, in the cathodes thereof may receive the bias from the amplifier unit 3A through the bias pad 63e on the amplifier unit 3A, the bonding wire 20i, the bias pad 23e and the bias line 7a on the functional optical device 2. Arrangements for the bias line similar to the former two light-receiving elements, 6a to 6b, are reflected in other two light-receiving elements, 6c and 6d, in the cathodes thereof. That is, the rest to light-receiving elements, 6c and 6d, may receive a bias from the amplifier unit 3B through the bias pad 63f on the amplifier unit 3B, the bonding wire 20j, the bias pad 23f and the bias line 7b provided on the functional optical device 2.

The functional optical device 2 may further provide ground pads, 23a to 23d, which are independent of the light-receiving elements, 6a to 6d, but connected with grounds pads, 63a to 63d, provided on the amplifier units, 3A and 3B, through bonding wires, 20e and 20h. Thus, an arrangement of the ground, which is constituted by the ground pads, 23a to 23d, on the functional optical device 2, the ground pads, 63a to 63d, on the amplifier units, 3A and 3B, and the bonding wires, 20e and 20h, connecting the former ground pads, 23a to 23d, with the latter ground pads, 63a to 63d, surround an arrangement of the signal, which is constituted by the signal pads, 21a to 21d on the functional optical device 2, the signal pads, 61a to 61d on the amplifier units, 3A and 3B, and the bonding wires, 20a to 20d, connecting the former signal pads, 21a to 21d, with the latter signal pads, 61a to 61d. Moreover, the bias pads, 23e and 23f, isolate the signal pads, 21a and 21b, and 21c and 21d, on the functional optical device 2. Besides, the bias pads, 63e and 63f, isolate the signal pads, 61a and 61b, and 61c and 61d, respectively. These arrangements may emulate a co-planar arrangement, where a signal line is put between ground lines, and suppress degradation of signal quality especially for high frequency components.

Moreover, as shown in FIG. 2, the ground pads, 23a to 23d, provide substrate vias 51 thereunder, and the vias 51 and the back surface of the substrate 10 are covered with a back metal 50. Because the functional optical device 2, and the amplifier units, 3A and 3B, are mounted on an electrically conductive substrate that is directly grounded; the ground pads, 23a to 23d, may be connected to the ground through shortened paths of the vias 51 and the back metal 50.

The amplifier units, 3A and 3B, may convert the photocurrents thus transferred from the light-receiving elements, 6a to 6d, into respective voltage signals, and amplify thus converted voltage signals. Specifically, the amplifier unit 3A may generate an amplified voltage signal in a differential mode corresponding to the optical signals, Lc1 and Lc2, with the two amplitude levels, while, the other amplifier unit 3B may generate another amplified voltage signal in the differential mode corresponding to the optical signals, Lc3 and Lc4, with the two amplitude levels. The amplifier units, 3A and 3B, are disposed such that front edges thereof, along which the pads, 61a to 61d, and 63a to 63f, are disposed, face the rear edge 2b of the functional optical device 2.

Figure 3:
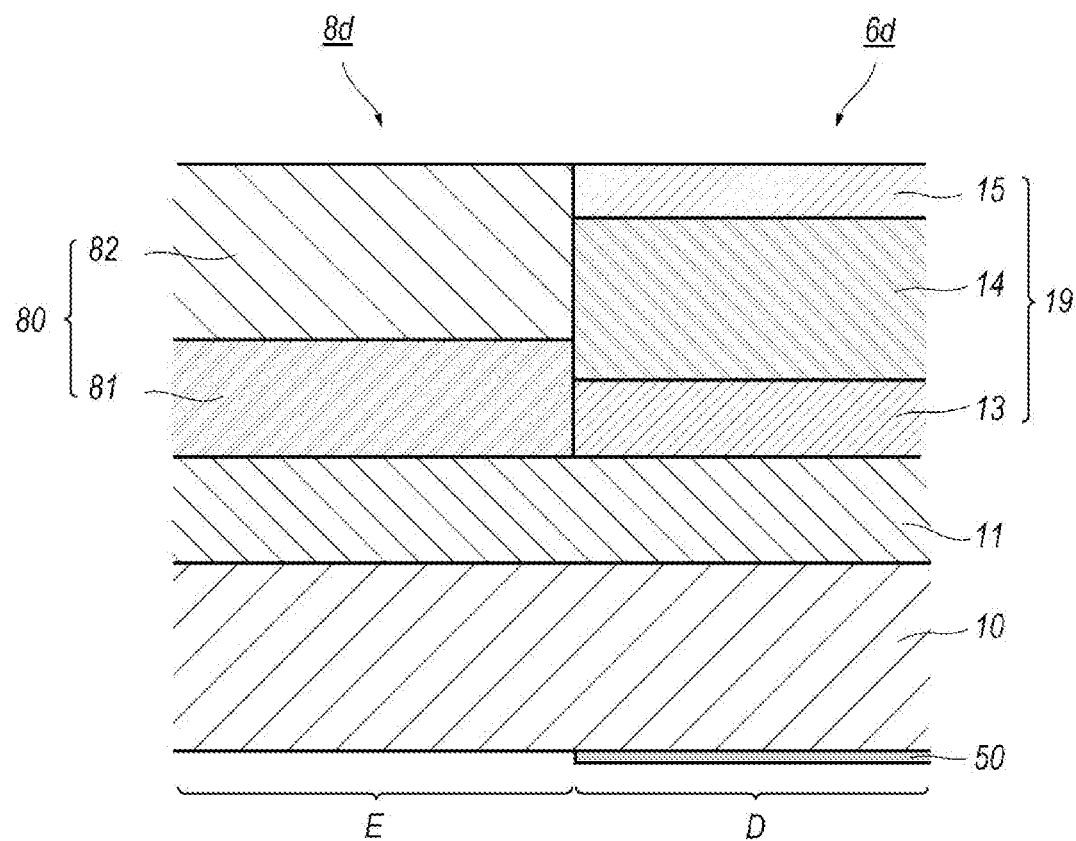
FIG. 3 magnifies a portion of a cross section of the functional optical device taken along the line III-III indicated in FIG. 1.

A cross section of a pair of the light-receiving elements, 6a and 6b, is shown in FIG. 2. Another pair of the light-receiving elements, 6c and 6d, shows the same cross section. While, the cross section of a portion that couples the optical waveguide 8d with the light-receiving element 6d is shown in FIG. 3. Other portions connecting the light-receiving elements, 6a to 6c, with the optical waveguides, 8a to 8c, are substantially same with that shown in FIG. 3. As shown in FIG. 3, the light-receiving element 6d and the optical waveguides 8d are integrated on the substrate 10 made of semi-insulating InP.

The arrangement of the light-receiving elements, 6a to 6d, will be first described. Referring to FIG. 3, the light-receiving element 6d provides an n-type buffer layer 11 and a photodiode (PD) structure 19 in a region D, where the PD structure 19 includes an absorption layer 13, a p-type cladding layer 14, and a p-type contact layer 15.

The n-type buffer layer 11, which may be made of InP doped with silicon (Si) by density at least $1 \times 10^{18}$ cm$^{-3}$, has a thickness of 1 to 2 μm. The n-type buffer layer 11 continuously and evenly extends in the region D for the light-receiving element 6b and in the region E for the optical waveguide 8f. That is, the light-receiving elements, 6a to 6d, have the n-type buffer layer 11 common to each other, where the n-type buffer layers 11 between the light-receiving elements, 6a and 6b, and 6c and 6d, are left without being removed by etching.

The absorption layer 13 may be made of un-doped InGaAs or InGaAs slightly or faintly doped with silicon (Si) by density of $3 \times 10^{16}$ cm$^{-3}$ at most and have a thickness of 0.1 to 0.4 μm. The p-type cladding layer 14 may be made of InP doped with zinc (Zn) by density at least $1 \times 10^{18}$ cm$^{-3}$ and have a thickness of 1 to 2.5 μm. The p-type contact layer 15 may be made of InGaAs doped with Zn by density at least $1 \times 10^{18}$ cm$^{-3}$ and have a thickness of 0.1 to 0.3 μm.

The light-receiving elements, 6a to 6d, may further provide an intermediate layer between the absorption layer 13 and the n-type buffer layer 11, where the intermediate layer may moderate band discontinuity ΔEc in the conduction bands between the n-type buffer layer 11 and the absorption layer 13. The intermediate layer may be made of InGaAsP with a bandgap wavelength of 1.4 μm and un-doped or slightly doped with Si by density of $1 \times 10^{16}$ cm$^{-3}$ at most. Or, the intermediate layer may be double layers each made of un-doped or slightly doped with Si by density at most $1 \times 10^{16}$ cm$^{-3}$ and having bandgap wavelengths of 1.3 and 1.1 μm, respectively. Such a double layer is often called as the graded layer.

Also, the light-receiving elements, 6a to 6d, may have another intermediate layer between the absorption layer 13 and the p-type cladding layer 14 in order to make response of the light-receiving elements, 6a to 6d, faster to accelerate minority carriers, namely holes in the present embodiment. The light-receiving elements, 6a to 6d, may further provide still another intermediate layer between the absorption layer 13 and the p-type cladding layer 14 to moderate band discontinuity in the valence bands therebetween. The intermediate layer between the absorption layer 13 and the p-type cladding layer 14 may have double layers each un-doped or slightly doped with Zn by density of $1 \times 10^{17}$ cm$^{-3}$ at most, and having bandgap wavelengths of 1.3 and 1.1 μm, respectively.

Referring to FIG. 2, the n-type buffer layer 11 in an upper portion thereof, the absorption layer 13, the p-type cladding layer 14, and the p-type contact layer 15 form a mesa surrounded by burying layers 18 made of semi-insulating InP doped with iron (Fe). The mesa may have a width of 1.5 to 3 μm and a height of 2 to 3.5 μm.

The light-receiving elements, 6a to 6d, may further provide two insulating films, 16 and 17, that cover and protect a top of the mesa and a top of the burying layer 18. The insulating films, 16 and 17, may be made of inorganic material containing silicon (Si) such as silicon nitride (SiN), silicon oxy-nitride (SiON), silicon di-oxide (SiO$_2$), and so on. The insulating films, 16 and 17, provide an opening on the top of the mesa, through which a p-type electrode 31 is in contact with the p-type contact layer 15. The p-type electrode 31, which operates as an anode of the light-receiving elements, 6a to 6d, may be formed by heat-treating eutectic alloy of gold zinc (Au) or platinum (Pt). An interconnection 32 is in contact with the p-type electrode 31, where the interconnection 32 extends along a direction connecting the front edge 2a with the rear edge 2b so as to connect the p-type electrode 31 with the signal pad, 21c and 21d. Thus, the interconnection 32 is converted into the signal pads, 21a to 21d. The interconnection 32 has an arrangement of stacked metals of titanium tungsten (TiW) and gold (Au), or titanium, platinum, and gold (Ti/Pt/Au). The signal pads, 21c and 21d, may be made of plated gold.

The insulating films, 16 and 17, may further provide another opening between the mesas, where the opening exposes the n-type buffer layer 11 on which n-type electrode 41 is in contact therewith, where the n-type electrode 41 may operate as a cathode common to the light-receiving elements, 6a and 6b, as shown in FIG. 2. The n-type electrode 41 extends substantially in parallel to the front edge 2a, or the rear edge 2b between the two light-receiving elements, 6a and 6b. The arrangements same with those above described are reflected in the n-type electrode 42 in the other two light-receiving elements, 6c and 6d.

The n-type electrodes 41 may be formed by heat-treating eutectic metal of gold germanium (AuGe) or AuGe containing nickel (AuGeNi). Provided on the n-type electrodes 41 are the bias lines, 7a and 7b, which extend parallel to the rear edge 2b. The bias lines, 7a and 7b, may be, made of stacked metals of titanium tungsten and gold (TiW/Au), or titanium, platinum, and gold (Ti/Pt/Au).

The substrate 10, as shown in FIG. 2 and FIG. 3, provides four vias 51 under the ground pads, 23a to 23d, where the vias 51 in side walls therein are covered with plated gold (Au). The vias 51 pierce the substrate 10 from the back surface to the top surface thereof. The ground pads, 23a to 23d, are connected with a back metal 50 through the vias 51, where the back metal 52 is grounded common to the amplifier units, 3A and 3B.

The optical waveguides, 8a to 8d, in cross sections thereof will be described. FIG. 3 shows the cross section of a portion where the optical waveguide 8d couples with the light-receiving element 6d, where the FIG. 3 is taken along the line III-III shown in FIG. 1, which is the optical axis of the optical waveguide 8d. The other optical waveguides, 8a to 8c, and the other light-receiving elements, 6a to 6c, have cross sections same with those shown in FIG. 3. The optical waveguide 8d provides, on the substrate 10, the n-type buffer layer 11 that is common to the light-receiving element 6d and waveguide structure 80 provided in an area E of the n-type buffer layer 11 next to the area D for the light-receiving element 6d. The waveguide structure 80 includes a core layer 81 provided on the n-type buffer layer 11 and a cladding layer 82 on the core layer 81. The n-type buffer layer 11, which is common with the light-receiving element 6d, as described above, operates as a lower cladding layer for the waveguide structure 80. The back metal 50 extends on a whole of the region D for the light-receiving elements, 6a to 6d; but the region E for the optical waveguides, 8a to 8f, and the coupling unit 5 exposes the back surface of the substrate 10.

The optical waveguide 8d forms, what is called, a butt-joint against the light-receiving element 6d. Specifically, the core layer 81 is in contact with the absorption layer 13 in the light-receiving element 6d. The core layer 81 may be made of semiconductor material substantially lattice-matching with the n-type buffer layer 11 and having refractive index greater than that of the n-type buffer layer 11. In a typical example, the core layer 81 may be made of InGaAsP with a bandgap wavelength of 1.05 μm and have a thickness of 0.3 to 0.5 μm. The cladding layer 82, which has refractive index smaller than that of the core layer 81, may be made of semiconductor material substantially lattice-matching with the core layer 81, typically un-doped InP, and preferably has a thickness of 1 to 3 μm such that a top surface thereof is leveled with a top surface of the p-type contact layer 15 in the light-receiving element 6d. The n-type buffer layer 11 in the area E, the core layer 81 and the cladding layer 82 form a mesa extending along the direction connecting the front edge 2 a with the rear edge 2b. The arrangement of the refractive indices and the thicknesses of the n-type buffer layer 11 in the area E, the core layer 81, and the upper cladding layer 82 may constitute an optical confinement structure to confine the optical signal Lc4 within the core layer 81. The insulating films, 16 and 17, also cover and protect sides of the mesa of the optical waveguide 8d.

Figure 9:
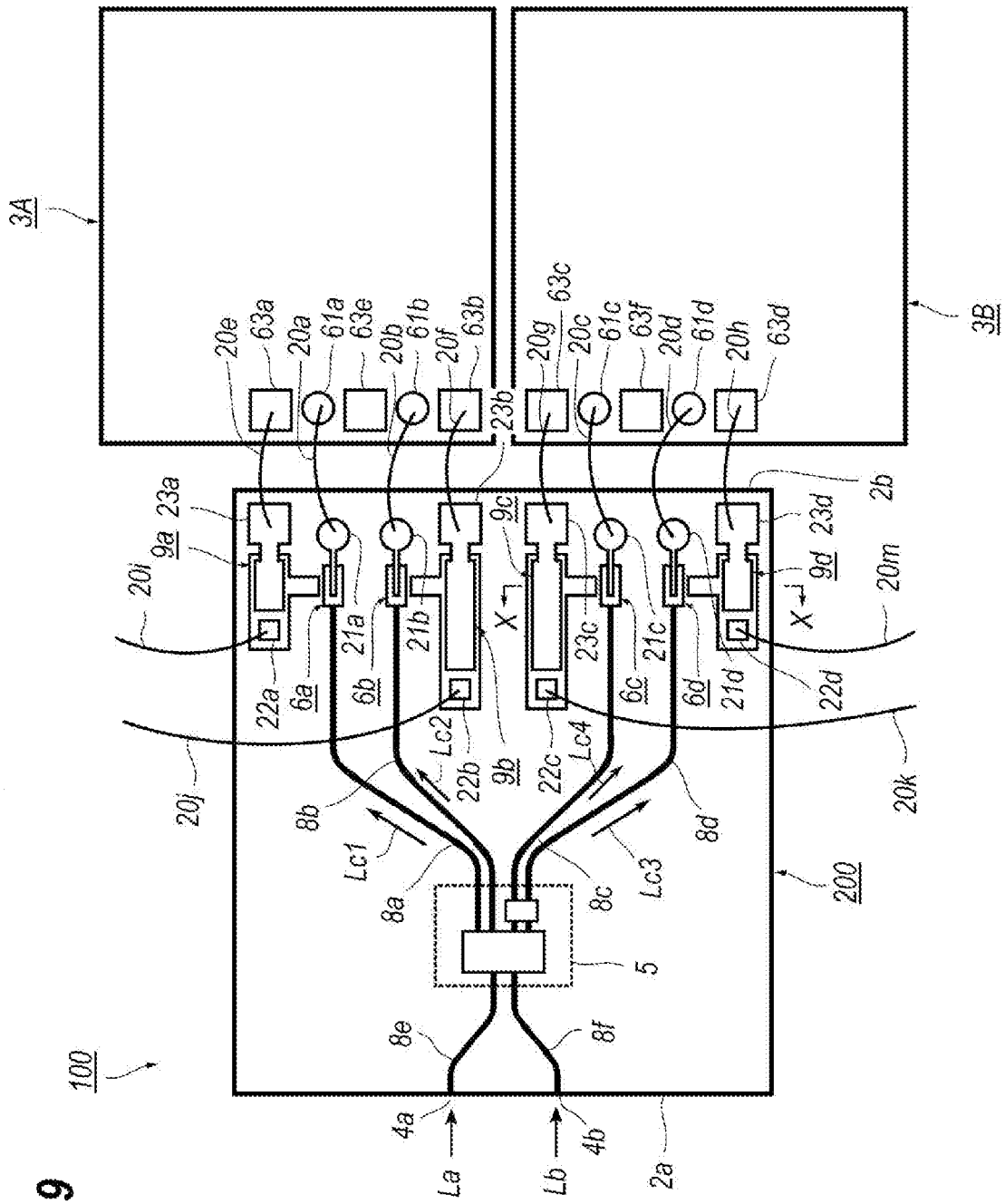
FIG. 9 is a plan view of a conventional optical apparatus comparable to that shown in FIG. 1 of the present invention.
Figure 10:
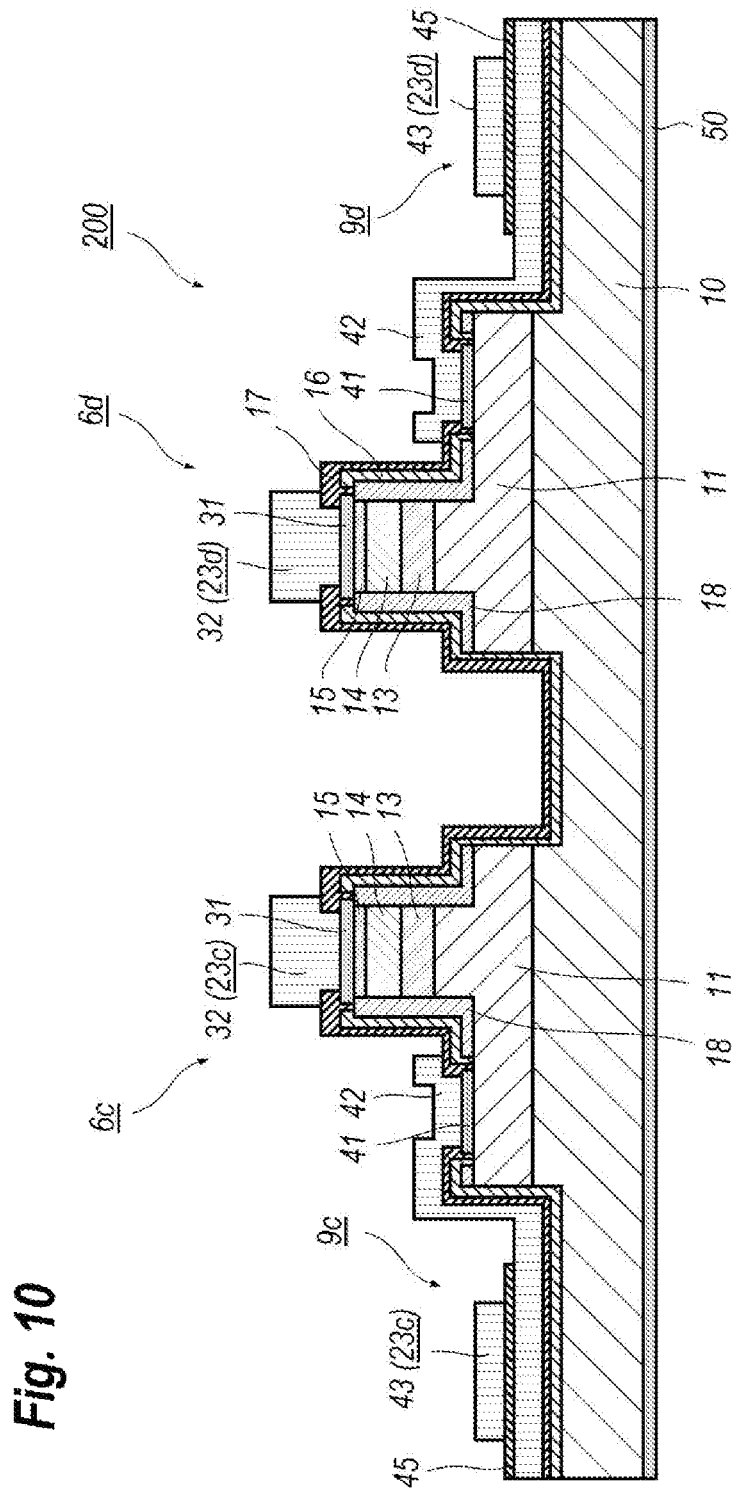
FIG. 10 shows a cross section of the functional optical device shown in FIG. 9, which is taken along the line X-X shown in FIG. 9.

The optical apparatus 1 thus described has various advantages below described. FIG. 9 is a plan view of a conventional light-receiving device 100 comparable with the light-receiving device 1; and FIG. 10 shows a cross section thereof taken along the line X-X indicated in FIG. 9. In a conventional arrangement around light-receiving elements; cathodes thereof independently receive biases because the n-type buffer layer 11 is divided into respective light-receiving elements, 6a to 6d, and the divided n-type buffer layer 11 provides the n-type electrodes 41 thereon independently. The bias lines 42 are extracted from the respective n-type electrodes to supply biases thereto. Because the conventional arrangement around the signal lines from the light-receiving elements, 6a to 6d, that is, the from the anodes thereof to the signal pads, 61a to 61d, on the amplifier units, 3A and 3B, through the signal pads, 21a to 21d, on functional optical device 200, and the bonding wires, 20a to 20d, provides no ground line between the signal lines. That is, the amplifier units, 3A and 3B, provide the ground pads, 63e and 63f, between the respective signal pads, 61a and 61b, and 61c and 61d; but the functional optical device 200 has no ground pads between the respective signal pads, 21a and 21b, and 21c and 21d, nor bonding wires to be extracted from the ground pads, 63e and 63f, between the bonding wires, 20a and 20b, and 20c and 20d. This arrangement does not emulate a co-planar configuration for the signal lines; accordingly, increases crosstalk between the signal lines and degrades quality of the signals carried on the signal lines.

On the other hand, the functional optical device 2 according to the present embodiment has a pair of light-receiving elements, 6a and 6b, or 6c and 6d, complementary operable to each other and having the cathodes connected to each other through the bias lines, 7a or 7b. Moreover, the bias lines, 7a and 7b, are connected with the bias pads, 63e and 63f, provided on the amplifier units, 3A and 3B, through the bonding wires, 20i and 20j, respectively. Here, the bias lines, 7a and 7b, and the bias pads, 63e and 63f, inherently have impedance low enough. Namely, those bias lines, 7a and 7b, and the bias pads, 63e and 63f, may be regarded as the ground line for the signals carrying on the signal lines.

Thus, the arrangement of the bias pads, 23e and 23f, the bonding wires, 20i and 20j, and the bias pads, 63b and 63e, may stabilize the ground potential around the light-receiving elements, 6a to 6d, and the amplifier units, 3A and 3B. Moreover, the bonding wires, 20i and 20j, for supplying the biases and the bonding wires, 20e to 20h, for supplying ground potential may put the bonding wires, 20a to 20d, for carrying the signals emulates co-axial configuration for carrying high frequency signals, and may resultantly suppress degradation of the signal quality carried thereon.

The ground pads, 23a to 23d, in the functional optical device 2 are directly connected with the back meal 50 in the back surface of the substrate 10 through the substrate vias 51. Moreover, the bonding wires, 20e to 20h, connecting the ground pads, 23a to 23d, with the ground pads, 63a, to 63d; the bonding wires, 20i and 20j, connecting the bias pads, 63e and 63f, with the bias pads, 23e and 23f; and the bonding wires, 20a to 20d, connecting the signal pads, 21a to 21d, with the signal pads, 61a to 61d, are alternately routed between the functional optical device 2 and the amplifier units, 3A and 3B. This arrangement for the ground line and the signal line may stabilize the ground potential between the functional optical device 2 and the amplifying devices, 3A and 3B, and may suppress the degradation in the signal quality carried from the functional optical device 2 to the amplifying devices, 3A and 3b.

First Modification

Figure 4:
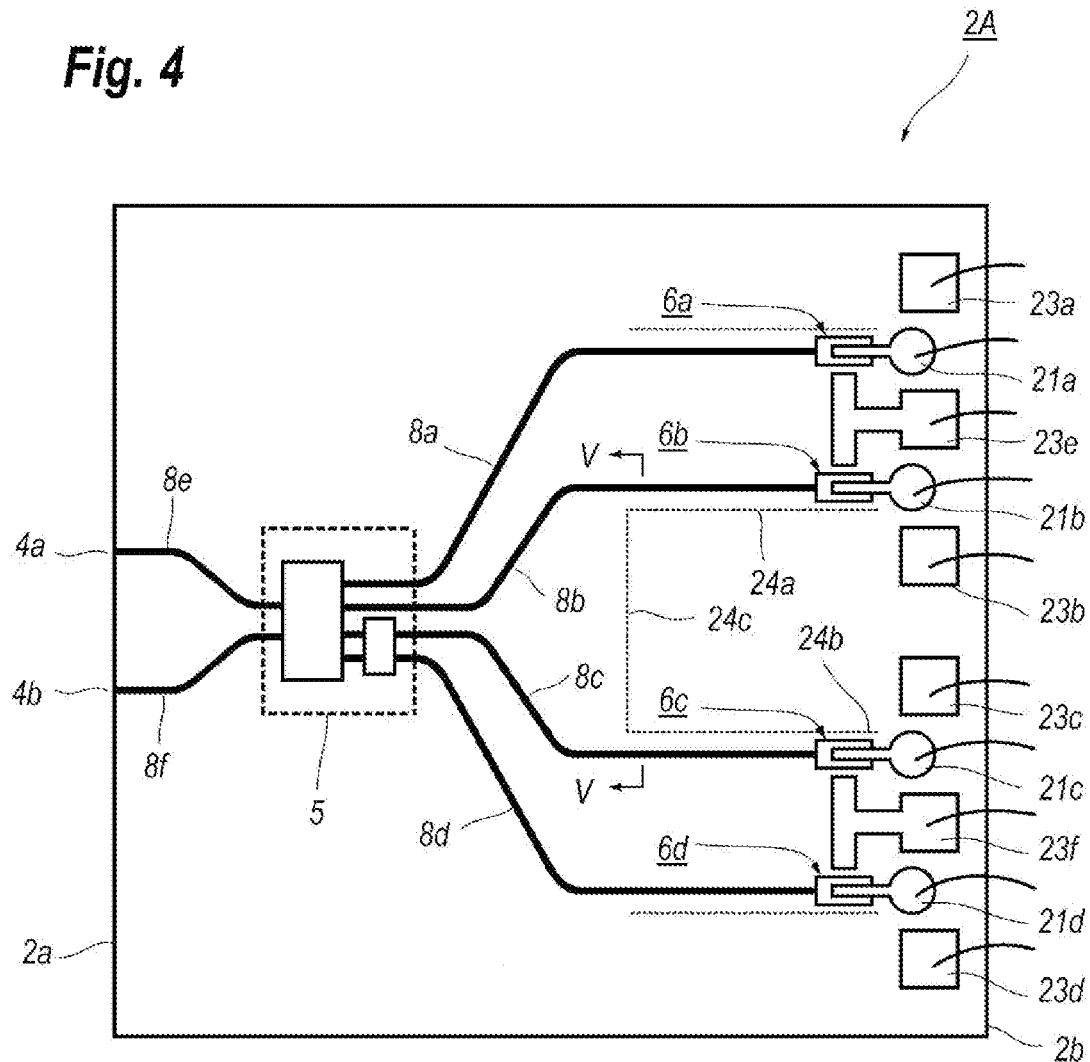
FIG. 4 is a plan view of a functional optical device according to the first modification of the functional optical device shown in FIG. 1.
Figure 5:
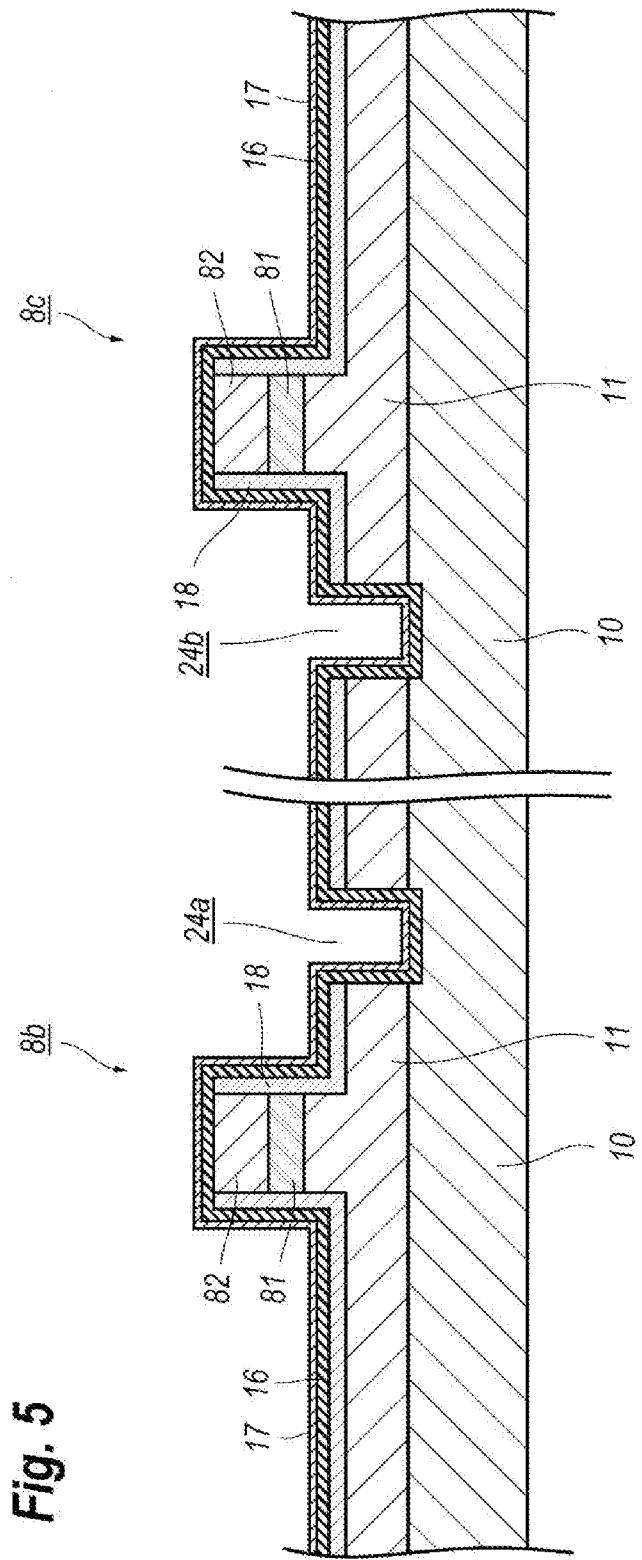
FIG. 5 shows a cross section of the functional optical device shown in FIG. 4.

FIG. 4 is a plan view of another functional optical device 2A that is modified from the functional optical device 2 shown in FIG. 1; and FIG. 5 shows a cross section of the functional optical device 2 taken along the line V-V indicated in FIG. 4. The modified functional optical device 2A may provide groove 24 that divides the n-type buffer layer 11 between the two optical waveguides, 8b and 8c. That is, the groove 24 divides the n-type buffer layer 11 for the pair of optical waveguides, 8a and 8b, from another pair of optical waveguides, 8c and 8d.

Specifically, the first portion 24a of the groove 24 linearly extends along the optical waveguide 8b and the light-receiving element 6b to a midway of the functional optical device 2A, while, the second portion 24b of the groove 24 also linearly extends along the optical waveguide 8e and the light-receiving element 6c to a midway of the functional optical device 2A. The third portion 24c of the groove 24 connects the ends of the former two grooves, 24a and 24b, at the midway of the functional optical device 2A. The other ends of the grooves, 24a and 24b, are terminated at the sides of the light-receiving elements, 6b and 6c, so as not to intersects the interconnections 32 extracted from the anodes of the light-receiving elements, 6b and 6c. The groove 24 thus configured may be formed by etching the n-type buffer layer 11 and a part of the substrate 10.

In the modified functional optical device 2A, the groove 24 isolates the first pair of the light-receiving elements, 6a and 6b, from the second pair of the light-receiving elements, 6c and 6d, by removing the n-type buffer layer 11 therebetween. Here, the former pair of the light-receiving elements, 6a and 6b, provides the bias line 7a common to each other, while, the latter pair of the light-receiving elements, 6c and 6d, provides the bias line 7b common to each other. Accordingly, the present modified embodiment for the functional optical device 2A may make the suppression of the crosstalk between the pairs of the light-receiving elements, 6a to 6d, consistent with the reduction of the number of the bonding wires and also the reduction of resistivity between the pairs of the light-receiving elements, 6a and 6b, and 6c and 6d.

Second Modification

Figure 6:
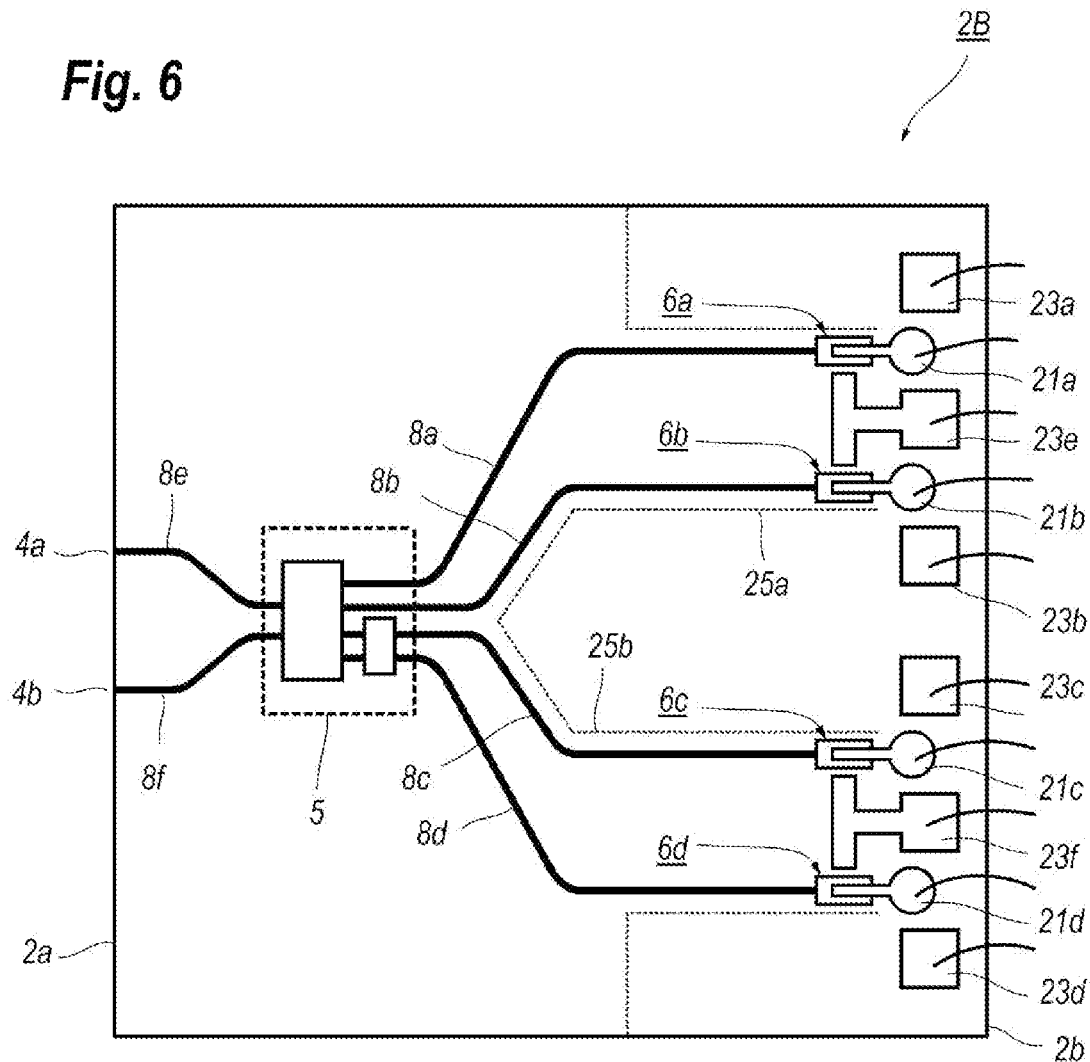
FIG. 6 is a plan view of a functional optical device according to the second modification of the functional optical device shown in FIG. 1.

FIG. 6 is a plan view showing another functional optical device 2B modified from the functional optical device 2 shown in FIG. 1. The functional optical device 2B has a feature that another groove 25 divides the n-type buffer layer 11 between the first pair of the light-receiving devices, 6a and 6b, and the second pair of the light-receiving devices, 6c and 6d. That is, the groove 25 is provided between the optical waveguides, 8d and 8e.

The groove 25 in the first portion 25a thereof extends along the optical waveguide 8b and the light-receiving device 6b to a position closer to the coupling unit 5 compared with the groove 24 provided in the former modification 2A. The second portion 25b of the groove 25 also extends along the optical waveguide 8c and the light-receiving element 6c to the point closer to the coupling unit 5. Two portions, 25a and 25b, of the groove 25 are connected to each other at the point next to the coupling unit 5. Thus, the arrangement of the groove 25 in the present modification may further isolate the first pair of the light-receiving elements, 6a and 6b, from the second pair of the light-receiving elements, 6c and 6d, and may suppress the crosstalk between the pairs of the light-receiving elements, 6a and 6b, and 6c and 6d, especially in high frequencies.

Third Modification

Figure 7:
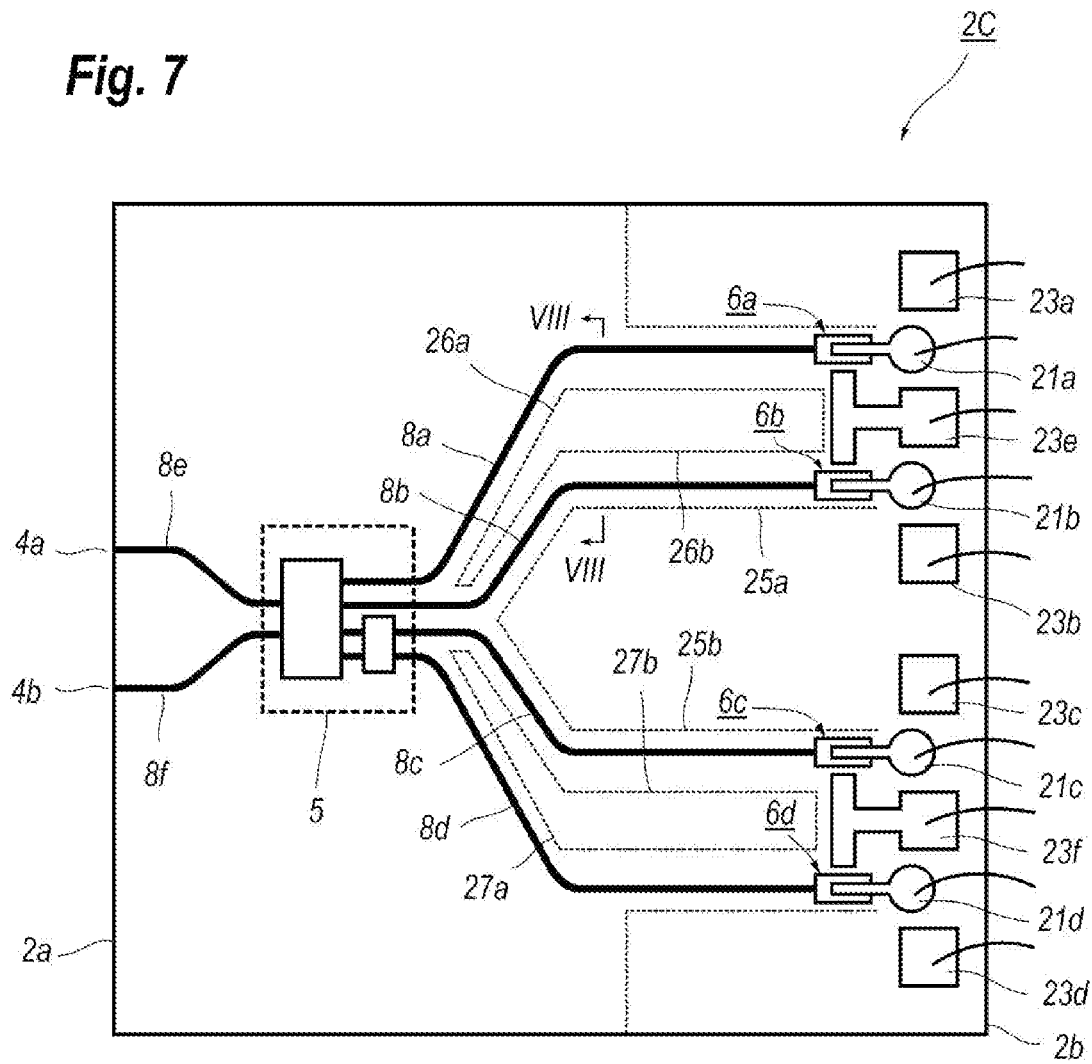
FIG. 7 is a plan view of a functional optical device according to the third modification of the functional optical device shown in FIG. 1.
Figure 8:
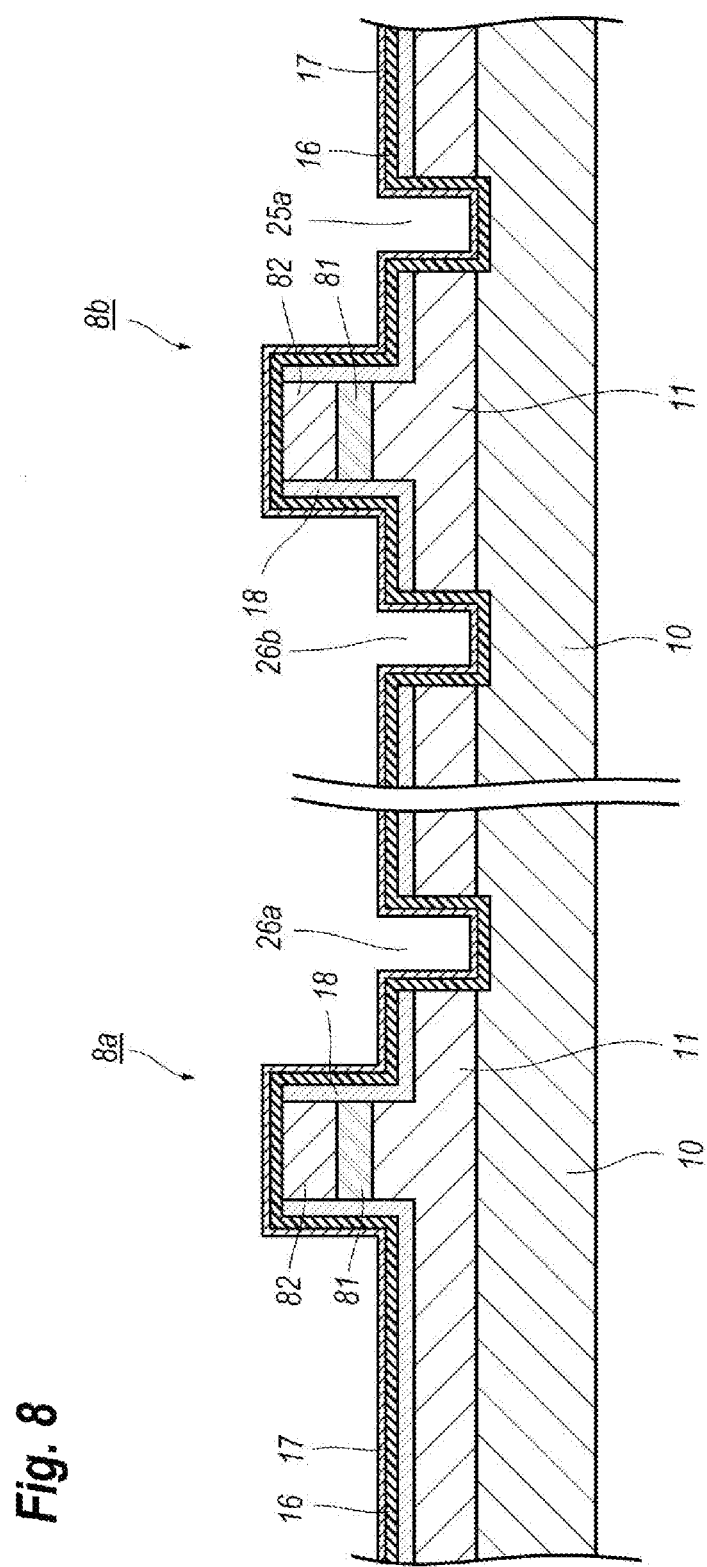
FIG. 8 shows a cross section of the functional optical device shown in FIG. 7 taken along the lint VIII-VIII indicated in FIG. 7.

FIG. 7 is a plan view showing still another functional optical device 2C that is modified from those shown in FIG. 1, and FIG. 8 shows a cross section of the functional optical device 2C that are taken along the lines, VIII-VIII, indicated in FIG. 7. Features of the functional optical device 2C shown in FIG. 7 are that other grooves, 26 and 27 are provided to further divide the n-type buffer layer 11.

The first portion 26a of the groove 26 extends along the optical waveguide 8a from the light-receiving element 26a to a point closer to the coupling unit 5, while, the second portion 26b of the groove 26 also extends but along the optical waveguide 8b and the light-receiving device 26b to a point closer to the coupling unit 5, and couples with the former groove 26a thereat. Thus, the groove 26 may divide the optical waveguides, 8a and 8b, and the light-receiving elements, 6a and 6b.

The other groove 27, in the first portion 27a thereof extends along the optical waveguide 8c and the light-receiving element 6c putting the optical waveguide 8c with the groove 25b therebetween; while the groove 27b extends along the optical waveguide 8d and the light-receiving element 6d. Accordingly, the groove 27 may isolate the optical waveguide 8d and the light-receiving element 6d from the optical waveguide 8c and the light-receiving element 6c.

Thus, the functional optical device 2C according to the present invention preferably provides a groove that divides the n-type buffer layer 11 at least one of between the optical waveguides, 8a and 8b, and between the optical waveguides, 8c and 8d. This arrangement of the groove and the light-receiving elements, 6a to 6d, may effective suppress the optical crosstalk between the paired light-receiving elements, 6a and 6b, and the optical crosstalk between the paired light-receiving elements, 6c and 6d, without degrading electrical resistivity between the paired light-receiving elements, 6a and 6b, and between the light-receiving elements, 6c and 6d.

While particular embodiments of the present invention have been described herein for purposes of illustration, many modifications and changes will become apparent to those skilled in the art. The core layer 81 in the optical waveguide, 8a to 8f, in a material thereof is not restricted to those included in the InGaAsP system; other systems, for instance, a semiconductor material having AlGaInAs system may be applicable as the core layer 81. Also, the functional optical device 2 may integrate other devices and circuit elements on the substrate 10. For instance, some electronic devices primarily formed by materials in the InP system, for instance, hetero-bipolar transistors (HBTs), resistors, and so on may be also integrated on the substrate 10. In such a case, the functional optical device 2 may show functions realized in the amplifier units, 3A and 3B. Accordingly, the appended claims are intended to encompass all such modifications and changes as fall within the true spirit and scope of this invention.

What is claimed is:

1. A functional optical device implemented in a coherent communication system, comprising:
    a coupling unit that generates a pair of optical signals complementary to each other by interfering a signal light with a local light;
    a pair of optical waveguides that carry the optical signals,
    a pair of light-receiving elements of a waveguide photodiode (PD) type each providing an anode and a cathode, the light-receiving elements generating a pair of photocurrents complementary to each other based on the optical signals, and
    a pair of signal pads each connected with the anodes of the light-receiving elements, a pair of ground pads, and a bias pad connected with the respective cathodes of the light-receiving elements; and
    a substrate that monolithically integrates the optical waveguides, the light-receiving elements, the signal pads, the ground pads, and the bias pad thereon,
    wherein the bias pad is arranged in-between the signal pads, and the signal pads and the bias pad are arranged in-between the ground pads.

2. The functional optical device according to claim 1, wherein the signal pads, the ground pads, and the bias pad are arranged along one edge of the substrate.

3. The functional optical device according to claim 1, wherein the substrate provides vias under the ground pads and a back metal on a back surface of the substrate, the vias piercing the substrate, and
    wherein the ground pads are directly connected with the back metal through the vias.

4. The functional optical device according to claim 1, wherein the substrate provides an n-type buffer layer on a whole top surface of the substrate, and
    wherein the light-receiving elements each provide a mesa on the n-type buffer layer, each mesa including an absorption layer and a p-type cladding layer, the n-type buffer layer and the p-type cladding layer forming an optical confinement structure that confines the optical signal within the absorption layer.

5. The functional optical device according to claim 1, wherein the substrate provides an n-type buffer layer on a whole surface of the substrate, and
    wherein the optical waveguides each provide a mesa on the n-type buffer layer, each mesa including a core layer and a cladding layer, the n-type buffer layer and the cladding layer forming an optical confinement structure that confines the optical signal within the core layer.

6. The functional optical device according to claim 1,
wherein the substrate provides an n-type buffer layer on a whole surface of the substrate,
wherein the substrate provides a pair of grooves,
wherein the light receiving elements are arranged in-between the pair of grooves, and
wherein the pair of grooves is formed by removing the n-type buffer layer and exposes the substrate therein.

7. The functional optical device according to claim 6,
wherein the grooves extend along the optical waveguides optically coupled with the light-receiving elements.

8. The functional optical device according to claim 7,
wherein the grooves each extend along the optical waveguides toward the coupling unit.

9. The functional optical device according to claim 1,
wherein the functional optical device includes a pair of units each including the optical waveguides, the light-receiving elements, the signal pads, the ground pads, and the bias pad,
wherein the coupling unit generates two pairs of the optical signals, one of the pairs of the optical signals being provided to one of the units, another of the pairs of the optical signals being provided to another of the units, and
wherein the functional optical device further includes a groove between the units, the groove exposing the substrate therein.

10. The functional optical device according to claim 1,
wherein the functional optical device includes a pair of units each including the optical waveguides, the light-receiving elements, the signal pads, the ground pads, and the bias pad,
wherein the coupling unit generates two pairs of the optical signals, one of the pairs of the optical signals being provided to one of the units, another of the pairs of the optical signals being provided to another of the units, and
wherein each of the units further includes a groove extending along one of the optical waveguides of the unit disposed closer to the other of the units, respectively.

11. The functional optical device according to claim 10,
wherein each of the units further includes a second groove extending along the one of the optical waveguides disposed closer to the other unit, and
wherein the one of the optical waveguides disposed closer to the other unit is arranged in-between the groove and the second groove.

12. An optical apparatus implemented in a coherent communication system, the optical apparatus optically receiving signal light and local light and outputting an electrical signal, the optical apparatus comprising:
a functional optical device claimed in claim 1;
an amplifier unit outputting the electrical signal, the amplifier unit providing a pair of ground pads connected with the ground pads in the functional optical device, a pair of signal pads connected with the signal pads in the functional optical device, and a bias pad connected in the functional optical device; and
bonding wires each connecting the ground pads, the signal pads, and the bias pads between the functional optical device and the amplifier unit,
wherein the bonding wire connecting the bias pad of the functional optical device with the bias pad of the amplifier unit is located between the bonding wires connecting the signals pads of the functional optical device with the signal pads of the amplifier unit, and
wherein the bonding wires connecting the signal pads of the functional optical device with the signal pads of the amplifier unit, and the bonding wire connecting the bias pad of the functional optical device with the bias pad of the amplifier unit, are located between the bonding wires connecting the ground pads of the functional optical device with the ground pads of the amplifier unit.

* * * * *